US012591008B2

(12) United States Patent
Kurotsuchi et al.

(10) Patent No.: US 12,591,008 B2
(45) Date of Patent: Mar. 31, 2026

(54) SEMICONDUCTOR DEVICE, VEHICLE-MOUNTED APPLIANCE, AND CONSUMER APPLIANCE

(71) Applicant: Rohm Co., Ltd., Kyoto (JP)

(72) Inventors: Yuji Kurotsuchi, Kyoto (JP); Takashi Esumi, Kyoto (JP); Tomokazu Okada, Kyoto (JP); Hiromitsu Kimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 144 days.

(21) Appl. No.: 18/427,039

(22) Filed: Jan. 30, 2024

(65) Prior Publication Data

US 2024/0168092 A1    May 23, 2024

Related U.S. Application Data

(63) Continuation of application No. PCT/JP2022/023921, filed on Jun. 15, 2022.

(30) Foreign Application Priority Data

Jul. 30, 2021    (JP) ................................. 2021-125938

(51) Int. Cl.
*G01R 31/317* (2006.01)
(52) U.S. Cl.
CPC .............................. *G01R 31/31727* (2013.01)
(58) Field of Classification Search
CPC .......................... G01R 31/31727; G06F 11/22
See application file for complete search history.

(56) References Cited

U.S. PATENT DOCUMENTS

| | | | | |
|---|---|---|---|---|
| 2003/0085731 A1* | 5/2003 | Iwase | ..................... | G11C 29/46 |
| | | | | 326/16 |
| 2004/0061518 A1* | 4/2004 | Watanabe | ............. | G06F 9/3802 |
| | | | | 712/E9.055 |
| 2010/0194400 A1* | 8/2010 | Baumann | ........... | G01R 31/3016 |
| | | | | 324/76.19 |
| 2013/0060508 A1* | 3/2013 | Teranishi | ................ | G06F 11/24 |
| | | | | 702/124 |
| 2023/0014174 A1* | 1/2023 | Chen | .................... | H05K 7/1492 |

FOREIGN PATENT DOCUMENTS

JP        2021-050924        4/2021

OTHER PUBLICATIONS

International Search Report and Written Opinion in International Appln. No. PCT/JP2022/023921, mailed on Sep. 20, 2022, 13 pages (with machine translation).

* cited by examiner

*Primary Examiner* — Lee E Rodak
*Assistant Examiner* — Zannatul Ferdous
(74) *Attorney, Agent, or Firm* — Fish & Richardson P.C.

(57) ABSTRACT

For example, a semiconductor device includes a first region configured to be always kept in a power-on state regardless of whether in a first operation mode or a second operation mode, a second region configured to be in a power-on state in the first operation mode and in a power-off state in the second operation mode, a first test circuit configured to be implemented in the first region, and a second test circuit configured to be implemented in the second region.

9 Claims, 4 Drawing Sheets

SEMICONDUCTOR DEVICE, VEHICLE-MOUNTED APPLIANCE, AND CONSUMER APPLIANCE

CROSS-REFERENCE TO RELATED APPLICATIONS

This nonprovisional application is a continuation application of International Patent Application No. PCT/JP2022/023921 filed on Jun. 15, 2022, which claims priority Japanese Patent Application No. 2021-125938 filed on Jul. 30, 2021, the entire contents of which are hereby incorporated by reference.

TECHNICAL FIELD

The invention disclosed herein relates to a semiconductor device, and also to a vehicle-mounted appliance and a consumer appliance employing such a semiconductor device.

BACKGROUND ART

Conventionally, a semiconductor device having a self-diagnosis function (what is called a BIST [built-in self-test] function) is known.

An example of known technology related to what has just been mentioned is seen in Patent Document 1 identified below.

CITATION LIST

Patent Literature

Patent Document 1: Japanese unexamined patent application publication No. 2021-050924

DESCRIPTION OF EMBODIMENTS

<Semiconductor Device (Application)>

Figure 1:
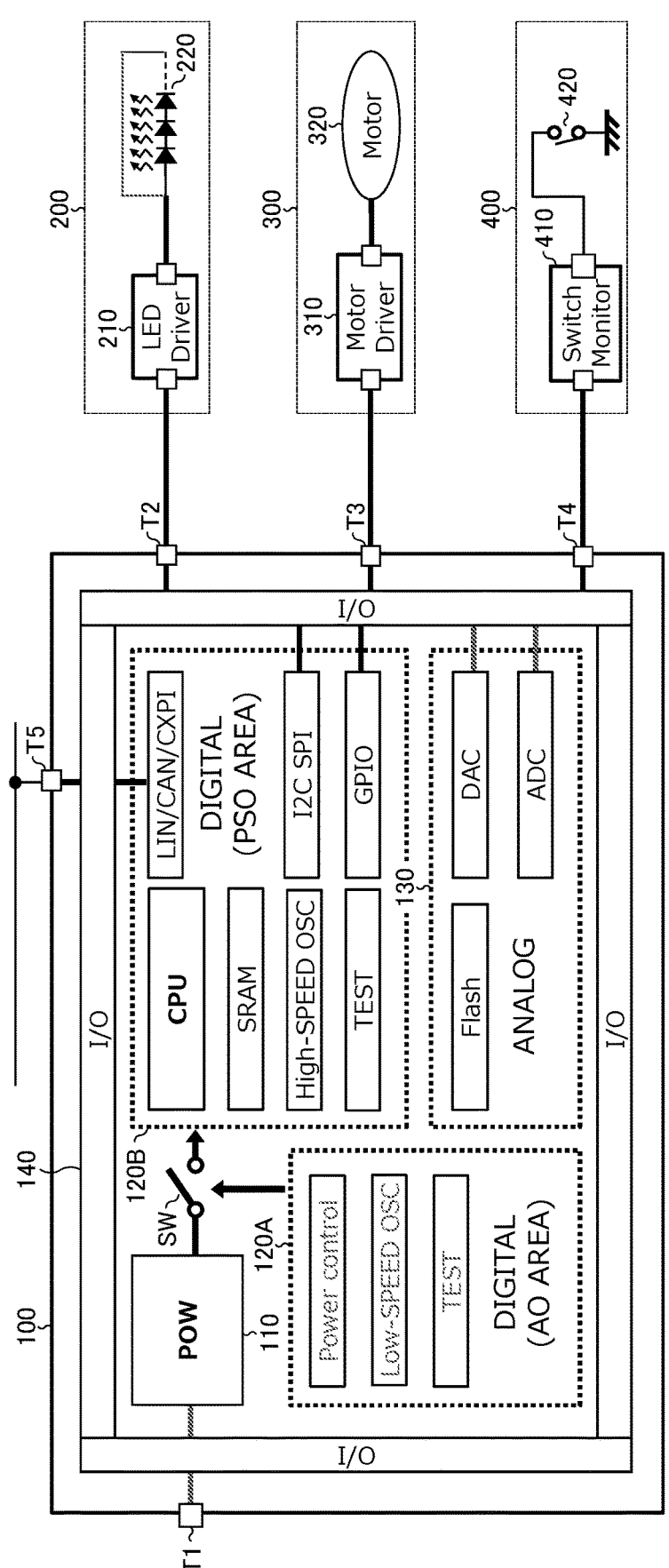
FIG. 1 is a diagram showing one configuration example of an application using a semiconductor device.

FIG. 1 is a diagram showing one configuration example of an application using a semiconductor device. The semiconductor device 100 in this configuration example is a vehicle-mounted integrated communication IC that receives instructions via a vehicle onboard network to control a controller (such as an ECU [electronic control unit]) incorporated in various terminal devices. The semiconductor device 100 includes, as a means for establishing electrical connection with outside the device, a plurality of external terminals T1 to T5.

The external terminal T1 is a power terminal for receiving electric power from a battery. The external terminals T2 to T4 are communication terminals for performing signal exchange with various terminal devices (for example, an LED [light emitting diode] lighting device 200, a motor device 300, and a switch device 400) by any protocol (such as an I2C [inter-integrated circuit], an SPI [serial peripheral interface], a GPIO [general-purpose input/output], or a PWM [pulse width modulation]). The external terminal T5 is a network terminal connected to any on-board network (such as LIN (local interconnect network), a CXPI (clock extension peripheral interface), and a CAN (controller area network).

The LED lighting device 200 includes an LED 210 and an LED driver IC 220 that controls the light emission of the LED 210 in response to instructions from the semiconductor device 100.

The motor device 300 includes a motor 310 and a motor driver IC 320 that controls the rotation of the motor 310 in response to instructions from the semiconductor device 100.

The switch device 400 includes a switch 410 and a switch monitor IC420 that monitors the on/off state of the switch 410 to notify the semiconductor device 100 of the monitoring result.

With reference still to FIG. 1, the internal configuration of the semiconductor device 100 will be described. The semiconductor device 100 in this configuration example includes a power supply circuit 110, a digital circuit 120 (digital circuits 120A and 120B in FIG. 1), an analog circuit 130, an I/O (input/output) circuit 140, and a power switch SW.

The power supply circuit 110 generates from a battery voltage fed to the external terminal T1 a predetermined internal supply voltage and supplies it to different blocks in the semiconductor device 100. The circuit blocks integrated in the semiconductor device 100 belong to either an AO (always on) region or a PSO (partially shut-off) region. The AO region is a region that is always kept in a power-on state regardless of whether the semiconductor device 100 is in a normal mode (corresponding to a first operation mode) or in a standby mode (corresponding to a second operation mode). On the other hand, the PSO region is arranged downstream of the power switch SW, and it is in a power-on state when the semiconductor device 100 is in the normal mode (with SW on) and is in a power-off state when the semiconductor device 100 is in the standby mode (with SW off). Needless to say, the power supply circuit 110 is implemented in the AO region.

The digital circuit 120A is one of the circuit blocks implemented in the AO region and includes a power controller, a low-speed oscillator, some test circuits, and the like.

The digital circuit 120B is one of the circuit blocks implemented in the PSO region and includes a CPU (central processing unit), an SRAM (static random-access memory), a high-speed oscillator, other test circuits, a LIN/CAN/CXPI interface, an I2C/SPI interface, a GPIO interface, and the like.

The analog circuit 130 includes a flash memory, a DAC (digital-to-analog converter), an ADC (analog-to-digital converter), and the like. The analog circuit 130 may be implemented in the AO region or in the PSO region.

The I/O circuit 140 is a front-end circuit that performs signal exchange between the external terminals T1 to T5 and internal circuits (the power supply circuit 110, the digital circuits 120A and 120B, and the analog circuit 130). The I/O circuit 140 may be arranged along the four sides of the semiconductor device 100 so as to surround the just-mentioned internal circuit as seen in a plan view of the semiconductor device 100.

The power switch SW, based on instructions from the digital circuit 120A (in particular, the power controller), switches between conducting and cut-off states the power supplying path from the power supply circuit 110 to the PSO region.

Semiconductor Device (Comparative Example)

Figure 2:
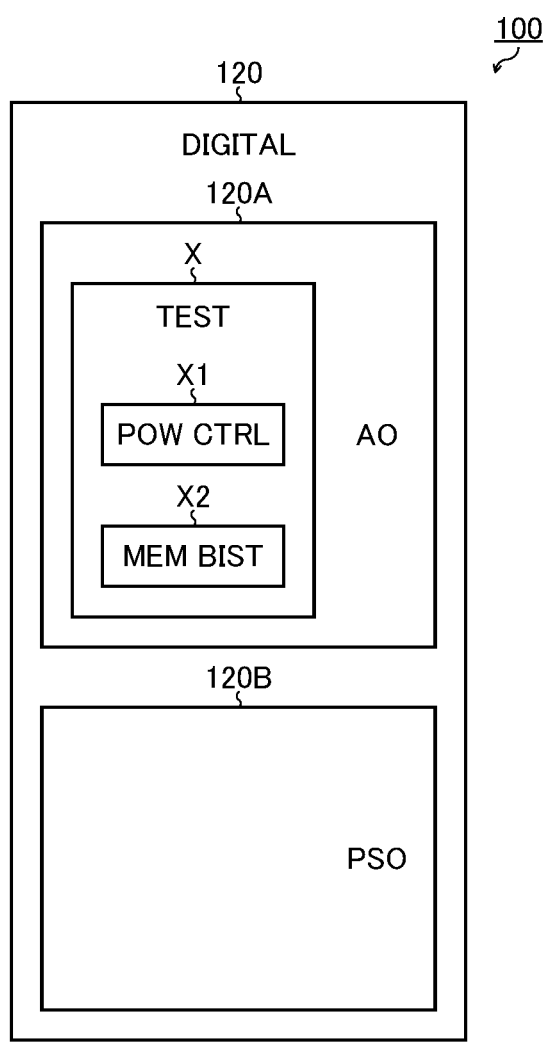
FIG. 2 is a diagram showing a comparative example of a semiconductor device.

FIG. 2 is a diagram showing a comparative example (that is, a common configuration example to be compared with the embodiments described later) of the semiconductor device 100. As described above, the digital circuit 120 in the semiconductor device 100 includes the digital circuit 120A that is implemented in the AO region and the digital circuit 120B that is implemented in the PSO region. In particular, for the comparative example, assuming that an entire test circuit X for achieving a self-diagnosis function is implemented in the AO region (that is, the digital circuit 120A), the description proceeds through comparison with the embodiments described later.

In general, the test circuit X has a function of switching the controlling agent of the power supply circuit 110 depending on whether the semiconductor device 100 is in a test mode (a third operation mode). For example, when the semiconductor device 100 is in the test mode, the test circuit X uses a power supply circuit control portion X1 implemented in it to control the power supply circuit 110; when the semiconductor device 100 is not in the test mode, the test circuit X transfers the privilege to control the power supply circuit 110 to the ordinary controller.

In this way, the test circuit X involved in the control of the power supply circuit 110 (in particular, a power supply circuit control portion X1) needs to be operating all the time so long as the power to the semiconductor device 100 is on. Thus, of the test circuit X, at least the power supply circuit control portion X1 needs to be implemented in the AO region.

On the other hand, the test circuit X includes, for example, a memory control functional block X2 used for a memory BIST. The memory is a circuit block used only in the normal mode (a non-standby mode) of the semiconductor device 100, and accordingly it is generally implemented in the PSO region. Thus, the memory BIST is performed only when power is supplied to the PSO region. In view of this, of the test circuit X, at least the memory control functional block X2 does not necessarily need to be implemented in the AO region.

Incidentally, the test circuit X is used only when the semiconductor device 100 is in the test mode, and is not used when the semiconductor device 100 is in a non-test mode (i.e., the normal mode or the standby mode). That is, the test circuit X is used solely to verify the operation of the semiconductor device 100 at the stage of test production, in a pre-shipment test of mass-produced products, or the like, and is basically not used by a user.

However, in the semiconductor device 100 of this comparative example, as mentioned previously, the entire test circuit X is implemented in the AO region. Thus, electric power is always supplied to the test circuit X that is never used after shipment, and this can lead to waste of electrical power. In particular, in the standby mode in which reduced power consumption is key, it is important to reduce the relatively high static power consumption in the test circuit X.

The following description presents a novel embodiment that can reduce static power consumption when the semiconductor device 100 is in the standby mode.

Semiconductor Device (First Embodiment)

Figure 3:
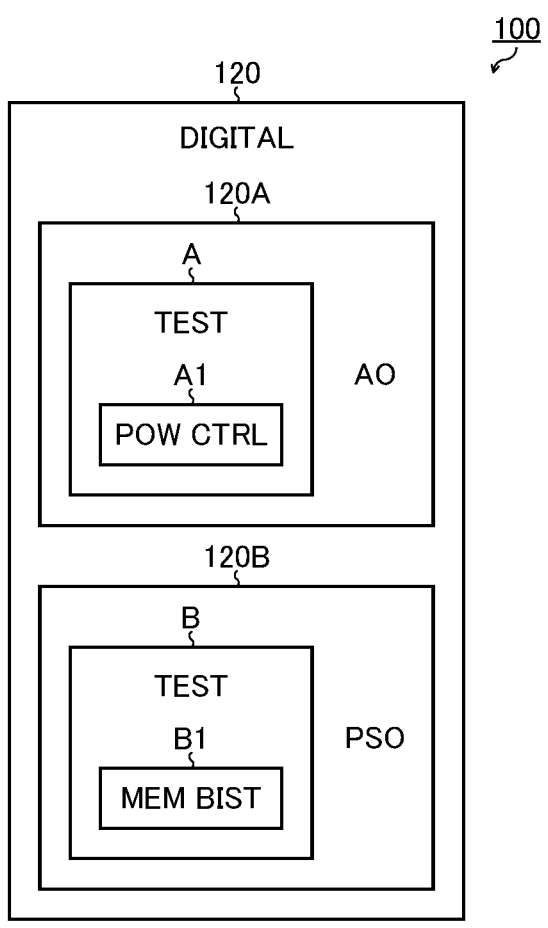
FIG. 3 is a diagram showing a semiconductor device according to a first embodiment.

FIG. 3 is a diagram showing a first embodiment of the semiconductor device 100. The semiconductor device 100 according to this embodiment, while being based on the comparative example (FIG. 2) described previously, includes, in place of the test circuit X of which the entirety is implemented in the AO region, a first test circuit A implemented in the AO region (that is, the digital circuit 120A) and a second test circuit B implemented in the PSO region (that is, the digital circuit 120B).

The first test circuit A includes a power supply circuit control functional block A1 and diagnoses the power supply circuit 110 implemented in the AO region. On the other hand, the second test circuit B includes a memory control functional block B1 and diagnoses a memory implemented in the PSO region.

As mentioned previously, the first test circuit A involved in the control of the power supply circuit 110 (in particular, the power supply circuit control functional block A1) needs to be operating all the time so long as the power to the semiconductor device 100 is on. Thus, the first test circuit A needs to be implemented in the AO region.

On the other hand, the second test circuit B (in particular, the memory control functional block B1) involved in the control of the memory only needs to operate when power is supplied to the memory, and accordingly it does not necessarily need to be implemented in the AO region. Thus, the second test circuit B is, together with the memory that it diagnoses, implemented in the PSO region.

With this configuration, when the semiconductor device 100 is in the standby mode, the power supply to the second test circuit B is cut off. It is thus possible to reduce the static power consumption of the second test circuit B, and hence to extend the life of the battery.

In particular, the memory control functional block B1 has a comparatively large logic scale (hence high static power consumption in the standby mode). Thus, implementing the memory control functional block B1 in the PSO region is highly effective in reducing the static power consumption of the semiconductor device 100.

Semiconductor Device (Second Embodiment)

Figure 4:
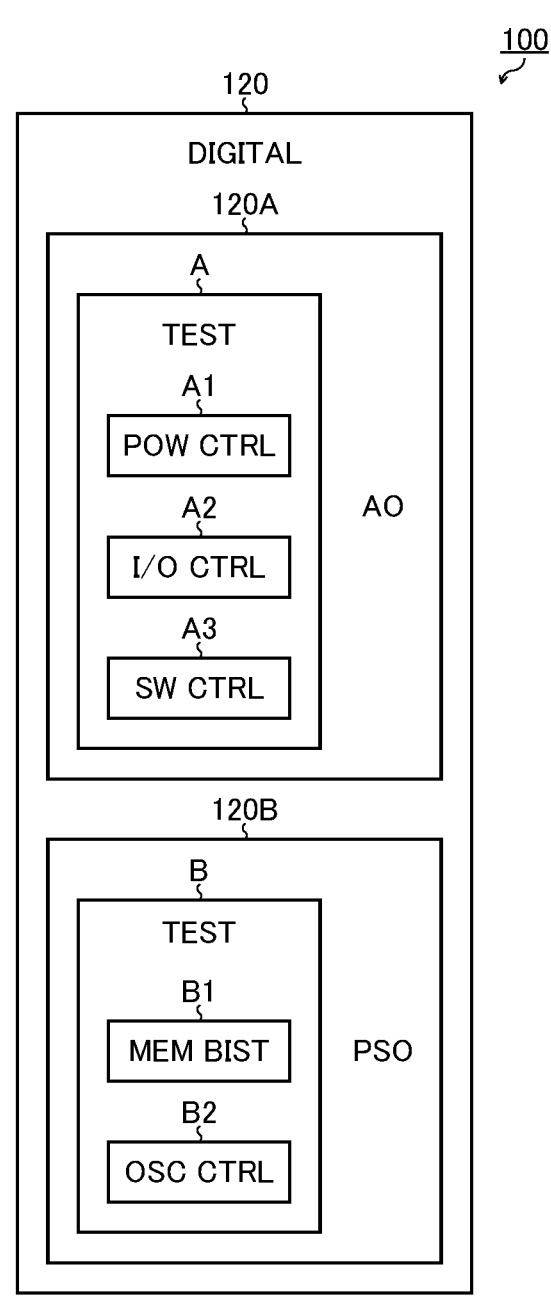
FIG. 4 is a diagram showing a semiconductor device according to a second embodiment.

FIG. 4 is a diagram showing a second embodiment of the semiconductor device 100. The semiconductor device 100 of this embodiment, while being based on the first embodiment described previously (FIG. 3), includes, as functional blocks implemented in either of the first and second test circuits A and B, an I/O control functional block A2, a power switch control functional block A3, and an oscillator control functional block B2.

The first test circuit A includes the power supply circuit control functional block A2 and diagnoses the I/O circuit 140 implemented in the AO region. The I/O circuit 140, even when the semiconductor device 100 is in the standby mode, needs to accept a standby recovery signal and the like fed in from outside the semiconductor device 100. Thus, the I/O circuit 140 needs to be operating all the time so long as the power to the semiconductor device 100 is on. Accordingly, the I/O control functional block A2 for controlling the I/O circuit 140 needs to be implemented in the AO region.

The first test circuit A includes the power switch control functional block A3 and diagnoses the power switch SW implemented in the AO region. The power switch SW is turned on and off according to whether the semiconductor device 100 is in the normal mode or the standby mode. Thus, the power switch SW, so long as the power to the semiconductor device 100 is on, needs to be ready to respond to on/off control. Accordingly, also the power switch control functional block A3 for controlling the power switch SW needs to be implemented in the AO region.

On the other hand, the second test circuit B includes the oscillator control functional block B2 and diagnoses a high-speed oscillator implemented in the PSO region. The high-speed oscillator generates a second clock signal CLK2 (for example, several tens of megahertz to several hundred megahertz) that is faster than a first clock signal CLK1 (for example, several tens of kilohertz) used in the AO region. The second clock signal CLK2 is used to drive a CPU (central processing unit) and the like implemented in the PSO region and does not necessarily need to be available when the semiconductor device 100 is in the standby mode. Thus, implementing the oscillator control functional block B2 for controlling the high-speed oscillator described above in the PSO region will not pose a particular problem.

The first internal circuit that is diagnosed by the first test circuit A can be, for example, circuit blocks implemented in the AO region (such as the power supply circuit 110, the I/O circuit 140, and the power switch SW). The second internal circuit that is diagnosed by the second test circuit B can be, for example, circuit blocks implemented in the PSO region (such as the memory and the high-speed oscillator).

In this way, by implementing in the PSO region as many control functional blocks required to achieve the self-diagnosis function of the semiconductor device 100 as possible, it is possible to reduce static power consumption (in particular, static power consumption ascribable to the second test circuit B) when the semiconductor device 100 is in the standby mode.

Although not specifically illustrated, for example, the first test circuit A can take the second internal circuit implemented in the PSO region as a diagnosis target.

Although not specifically illustrated either, for example, the first internal circuit, which is the target of diagnosis by the first test circuit A, and the second internal circuit, which is the target of diagnosis by the second test circuit B, may each include a logic circuit. That is, the first and second test circuits A and B may each have a function of controlling the logic circuit.

In a logic scan test, a scan test control circuit may be implemented in the first test circuit A, and the first internal circuit (its logic circuit) and the second internal circuit (its logic circuit) may be taken as test targets simultaneously.

<Applications>

While the embodiment described above deals with an example of application to vehicle-mounted appliances, this is not meant to limit the applicability of a semiconductor device having a test circuit implemented in a split form in both an AO and a PSO region; it can be suitably used also in, for example, various electronic appliances (battery-driven consumer appliances and the like) in which power saving is required.

<Overview>

To follow is an overview of the various embodiments described above.

For example, according to one aspect of what is disclosed herein, a semiconductor device includes a first region configured to be always kept in a power-on state regardless of whether in a first operation mode or in a second operation mode, a second region configured to be in a power-on state in the first operation mode and in a power-off state in the second operation mode, a first test circuit configured to be implemented in the first region, and a second test circuit configured to be implemented in the second region. (A first configuration.)

In the semiconductor device according to the first configuration described above, preferably, the first test circuit takes a first internal circuit implemented in the first region or a second internal circuit implemented in the second region as a diagnosis target, and the second test circuit takes the second internal circuit as a diagnosis target. (A second configuration.)

In the semiconductor device according to the second configuration described above, preferably, the first internal circuit includes a power supply circuit, and the first test circuit has a function of controlling the power supply circuit. (A third configuration.)

In the semiconductor device according to the second or third configuration described above, preferably, the first internal circuit includes an I/O circuit, and the first test circuit has a function of controlling the I/O circuit. (A fourth configuration.)

In the semiconductor device according to any of the second to fourth configurations described above, the first internal circuit includes a power switch configured to switch a power supplying path to the second region between conducting and cut-off states, and the first test circuit has a function of controlling the power switch. (A fifth configuration.)

In the semiconductor device according to any of the second to fifth configurations described above, the second internal circuit includes a memory, and the second test circuit has a function of controlling the memory. (A sixth configuration.)

In the semiconductor device according to any of the second to sixth configurations described above, the second internal circuit includes an oscillator configured to generate a second clock signal that is faster than a first clock signal used in the first region, and the second test circuit has a function of controlling the oscillator. (A seventh configuration.)

In the semiconductor device according to the second configuration described above, preferably, the first and second internal circuits include a logic circuit. (An eighth configuration.)

In the semiconductor device according to any of the first to eighth configurations described above, the first and second test circuits are both digital circuits. (A ninth configuration.)

According to another aspect of what is disclosed herein, a vehicle-mounted appliance includes the semiconductor device according to any of the first to ninth configurations described above. (A tenth configuration.)

According to yet another aspect of what is disclosed herein, a consumer appliance includes the semiconductor device according to any of the first to ninth configurations described above. (An eleventh configuration.)

<Further Modifications>

The various technical features disclosed herein may be implemented in any other manners than in the embodiments described above, and allow for any modifications made without departure from their technical ingenuity. That is, the embodiments described above should be considered to be illustrative in all respects and should not be considered to be restrictive. It should be understood that the technical scope of the present invention is defined by the scope of claims and encompasses any modifications made in a scope and sense equivalent to the scope of claims.

The invention claimed is:

1. A semiconductor device comprising:

a first region configured to be always kept in a power-on state regardless of whether in a first operation mode or in a second operation mode;

a second region configured to be in a power-on state in the first operation mode and in a power-off state in the second operation mode;

a first test circuit configured to be implemented in the first region; and a second test circuit configured to be implemented in the second region, wherein the first test circuit is configured to take a first internal circuit implemented in the first region or a second internal circuit implemented in the second region as a diagnostic target, and the second test circuit is configured to take the second internal circuit as a diagnostic target, the second internal circuit includes an oscillator configured to generate a second clock signal that is faster than a first clock signal used in the first region, and the second test circuit is configured to control the oscillator.

2. The semiconductor device according to claim 1, wherein the first internal circuit includes a power supply circuit, and the first test circuit is configured to control the power supply circuit.

3. The semiconductor device according to claim 1, wherein the first internal circuit includes an I/O circuit, and the first test circuit is configured to control the I/O circuit.

4. The semiconductor device according to claim 1, wherein the first internal circuit includes a power switch configured to switch a power supplying path to the second region between conducting and cut-off states, and the first test circuit is configured to control the power switch.

5. The semiconductor device according to claim 1, wherein the second internal circuit includes a memory, and the second test circuit is configured to control the memory.

6. The semiconductor device according to claim 1, wherein the first and second internal circuits include a logic circuit.

7. The semiconductor device according to claim 1, wherein the first and second test circuits are both digital circuits.

8. A vehicle-mounted appliance comprising the semiconductor device according to claim 1.

9. A consumer appliance comprising the semiconductor device according to claim 1.

* * * * *